United States Patent [19]
Yamamoto et al.

[11] 4,158,220
[45] Jun. 12, 1979

[54] PRINTED CIRCUIT CARD CONSTRUCTION

[75] Inventors: Haruhiko Yamamoto, Yokohama; Yoshiaki Udagawa, Tokyo; Yoshinao Hirose, Kawasaki, all of Japan

[73] Assignee: Fujitsu Limited, Japan

[21] Appl. No.: 862,498

[22] Filed: Dec. 20, 1977

[30] Foreign Application Priority Data

Dec. 29, 1976 [JP] Japan .............................. 51-160306

[51] Int. Cl.$^2$ .......................................... H02B 1/02
[52] U.S. Cl. ....................................... 361/415; 361/407
[58] Field of Search ................. 361/415, 407, 390; 339/75 MP, 176 MP

[56] References Cited

U.S. PATENT DOCUMENTS

| | | | |
|---|---|---|---|
| 3,259,807 | 7/1966 | Drugan et al. | 361/415 |
| 3,328,646 | 6/1967 | Caillat | 361/415 |
| 3,351,876 | 11/1967 | Conrad | 361/407 |
| 3,495,134 | 2/1970 | Collins et al. | 361/407 |
| 3,576,515 | 4/1971 | Frantz | 361/415 |

Primary Examiner—David Smith, Jr.
Attorney, Agent, or Firm—Staas & Halsey

[57] ABSTRACT

Disclosed is a printed circuit card construction comprising laminated conductor plates, a plurality of poles mounted on the laminated conductor plates, a plurality of mother boards fixed by two adjacent poles, a plurality of Input/Output connectors supported by the mother boards for holding each printed circuit card, and a plurality of power sources, wherein the poles and the power sources are directly connected to the corresponding conductor plates of the laminated conductor plates, which poles act as both mechanical means for supporting the mother boards and electrical means for supplying power to the printed circuit cards.

19 Claims, 19 Drawing Figures

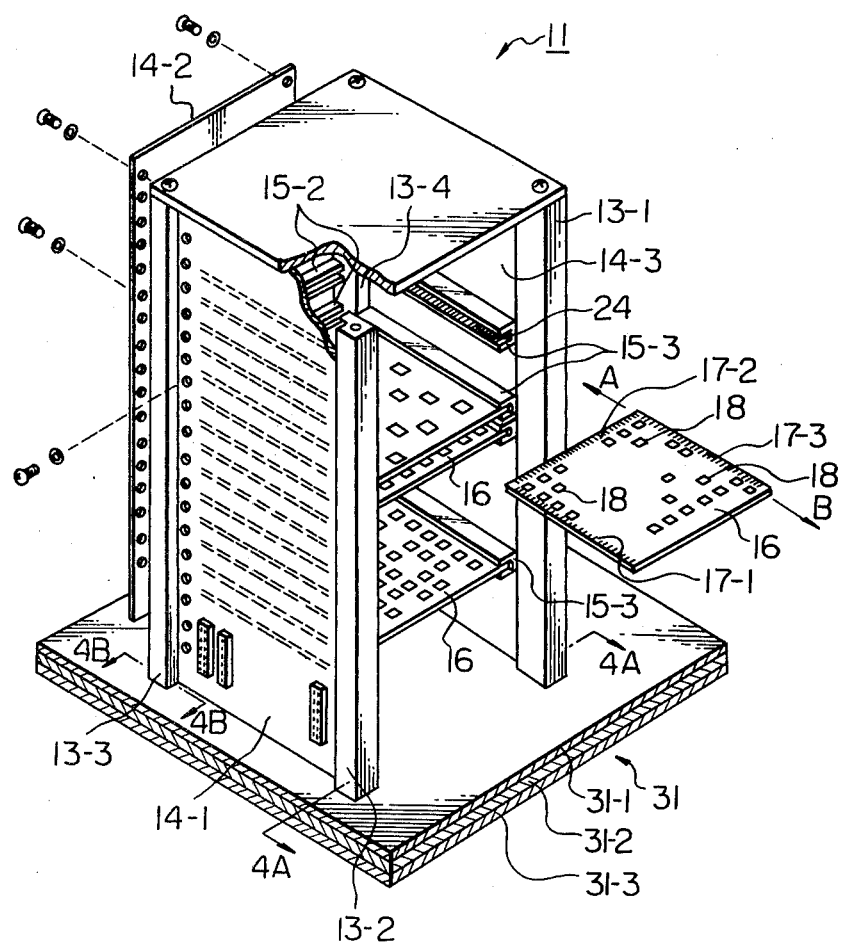

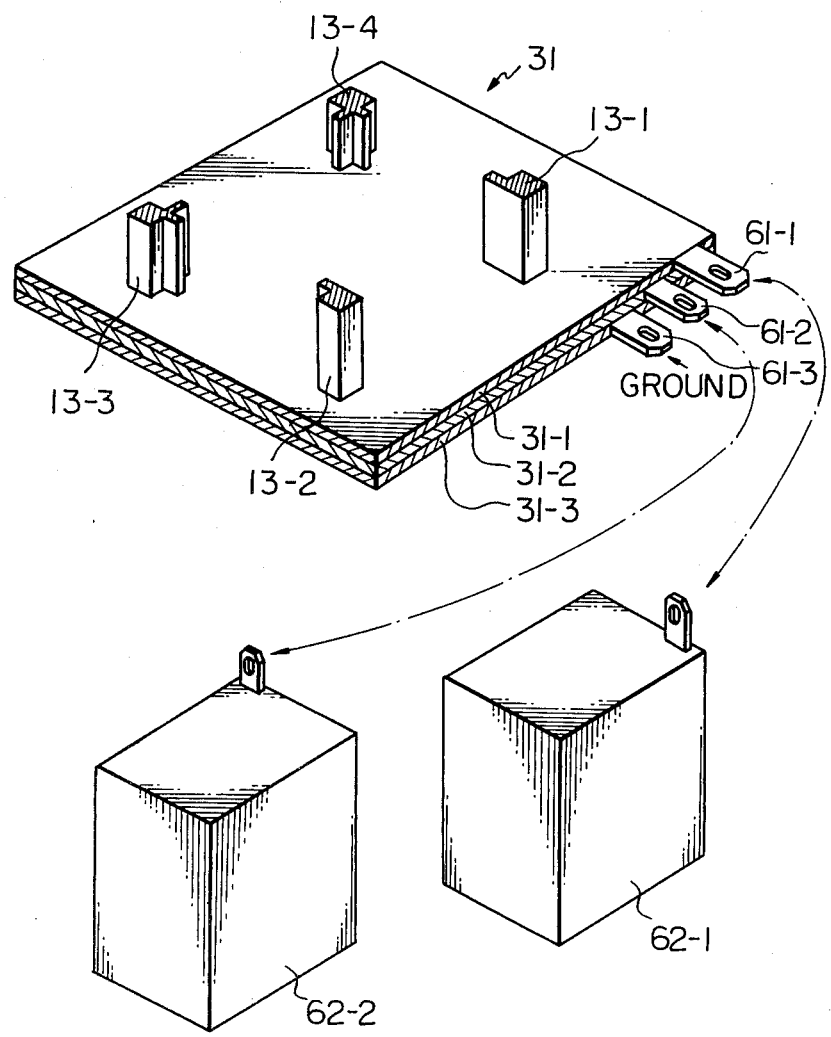

PRINTED CIRCUIT CARD CONSTRUCTION

BACKGROUND OF THE INVENTION

1. Field of the Invention

The present invention relates to a computer construction and more particularly to a printed circuit card construction used therein.

2. Description of the Prior Art

In recent years, the scale of the computer system has become considerably large. Therefore, the conventional IC (Integrated Circuit) and LSI (Large-Scale Integrated Circuit) are not sufficient for constructing each unit of logic circuits used in the large-scale computer system. Accordingly, an LSI having a great number of gate-circuits such as an ultra-LSI is very useful for constructing each unit of logic circuits used in such large-scale computer systems. In the large-scale computer system which is constructed by mounting a large number of ultra-LSIs on the printed circuit cards, an efficient printed circuit card construction must be employed therein.

In the prior art, there are two different kinds of printed circuit card constructions: firstly, the so-called shelf-type printed circuit card construction and, secondly, the printed circuit card construction which was disclosed in the U.S. Pat. No. 3,903,404. However, the two above-mentioned printed circuit card constructions have the following defects. The shelf-type construction has the defect wherein the total number of I/O (Input-/Output) pins printed on one side of each printed circuit card is very small as compared to the total number of gates included in the ultra-LSIs being mounted on each printed circuit card. Regarding the latter construction of the U.S. Pat. No. 3,903,404, it has the following defect that, although this construction can overcome the defect of the above-mentioned shelf-type construction, the total length of the lead wires which electrically connect ultra-LSIs mounted on one printed circuit card with cooperating ultra-LSIs mounted on another printed circuit card is extremely increased.

SUMMARY OF THE INVENTION

It is desirable to provide a printed circuit card construction which can (1) include a large number of I/O pins corresponding to the total number of gates; (2) minimize the total length of the lead wires; (3) decrease the impedance of the power supply means; and (4) carry out easy maintenance of the printed circuit cards.

Therefore, it is an object of the present invention to provide a unique printed circuit card construction which can simultaneously satisfy the above items (1) through (4).

The present invention will be apparent from the following description in which the preferred embodiments are set forth in detail in conjunction with the accompanying drawings, wherein:

BRIEF DESCRIPTION OF THE DRAWINGS

FIG. 3 is a perspective view of the printed circuit card construction shown in FIG. 1, showing a modification of the base 12 shown in FIG. 1;

FIG. 6 is a perspective view of a laminated conductor plate 31 of FIG. 3, which laminated conductor plate is provided with lead terminals, according to the present invention;

DESCRIPTION OF THE PREFERRED EMBODIMENTS

Figure 1:
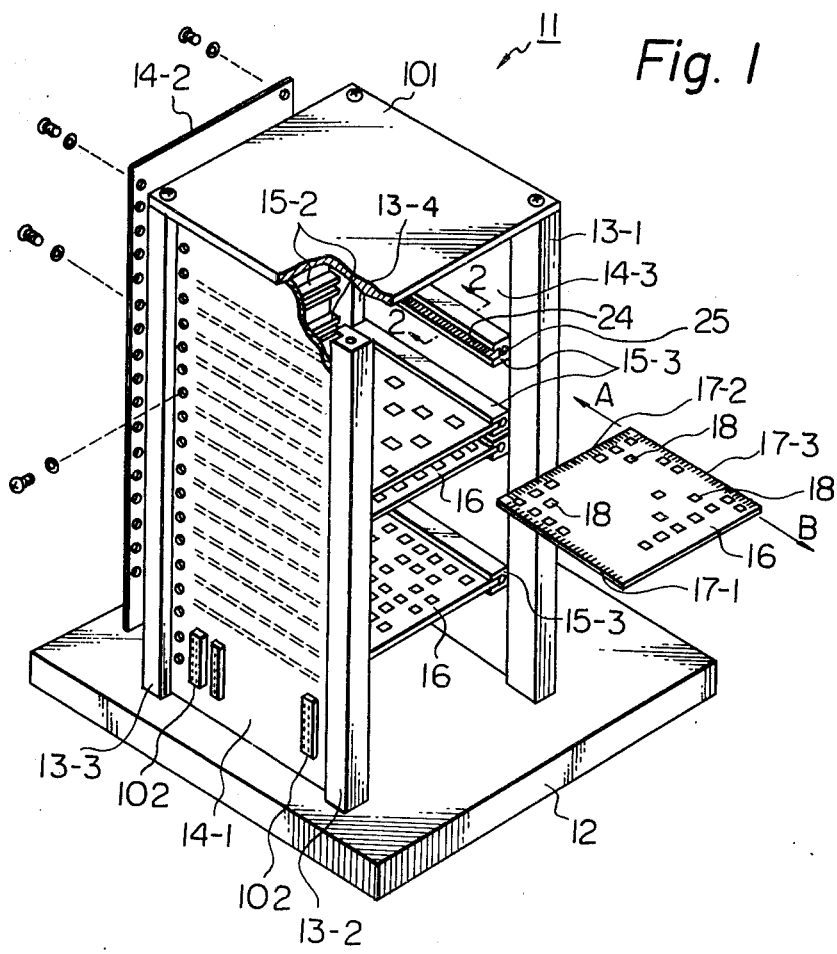
FIG. 1 is a perspective view of a printed circuit card stack used in a printed circuit card construction, according to the present invention.

FIG. 1 is a perspective view of a printed circuit card stack used in a printed circuit card construction, according to the present invention. In FIG. 1, a printed circuit card stack 11 is mounted on a base 12. The stack 11 is comprised of four poles 13-1 through 13-4. Poles 13-2 and 13-3 support a mother board 14-1; poles 13-3 and 13-4 support a mother board 14-2; and poles 13-4 and 13-1 support a mother board 14-3. Each of the mother boards 14-1 through 14-3 has a plurality of I/O (Input/Output) connectors. Only the I/O connectors 15-2 and 15-3 are shown in FIG. 1. A printed circuit card 16 is moved along the direction of the arrow A and inserted into the corresponding three I/O connectors, wherein each of the three I/O connectors is respectively fixed to the mother boards 14-1 through 14-3. The card 16 has I/O pins 17-1, 17-2 and 17-3 printed on its three peripheries. Each printed I/O pin is electrically connected to the corresponding pin of an exposed LSI chip or an LSI package 18. When a card 16 is inserted into the three corresponding I/O connectors 15-2, 15-3, 15-1 (FIG. 10A), each of the printed I/O pins is electrically connected with a corresponding I/O contact. A large number of I/O contacts are held in each I/O connector. The card 16 may also be moved along the direction of the arrow B and then taken out from the stack 11. It should be noted that, in the shelf-type printed circuit card construction of the prior art, the so-called back panel is located only on a plane corresponding to the plane along which the mother board 14-2 (FIG. 1) is located. Accordingly, only the printed I/O pins 17-2 (FIG. 1) can be mounted on a card 16 (FIG. 1); therefore, an ultra-LSI package having a large number of pins cannot be mounted on the card. Contrary to this, in the present invention, since additional I/O connectors are fixed to both mother boards 14-1 and 14-3 (FIG. 1), printed I/O pins 17-1 and 17-3 can be further mounted on the card. Thus, the ultra-LSI packages having a large number of pins can be mounted on the card. It should also be noted that, in the printed circuit card construction of the U.S. Pat. No. 3,903,404, since cards are arranged horizontally along a single flat plane, the total length of the lead wires, which electrically connect an LSI mounted on one card with a cooperating LSI mounted on another card, becomes extremely long. Contrary to this, in the present invention, since the cards 16 are laminated and constructed to form the stack 11, the total length of the lead wires can be reduced as compared to the construction of the above-cited U.S. Patent. In stack 11 of the present invention, the lead wires are formed in a conductive pattern printed inside and along the mother boards 14-1 through 14-3 (FIG. 1). It should be further noted that the poles 13-1 through 13-4 in the present invention function simultaneously as supporting poles for supporting respective mother boards (14-1 to 14-3) and as power supply means. Accordingly, the poles 14-1 through 14-3 are made of a conductive material such as copper or aluminum. It is apparent that since the cross-sectional area of each pole is very large, the impedance of the power supply means will be considerably reduced. The poles 14-1 through 14-3, acting as power supply means, may be electrically connected with a respective power source (not shown) by means of appropriate connectors (not shown). Such apropriate connectors according to the present invention will be explained hereinafter.

In FIG. 1, each I/O connector (15-2, 15-3) may be comprised of a flexible connector or a known zero-insertion-force connector. However, it is most preferable to use a zero-insertion-force connector.

Figure 2A:
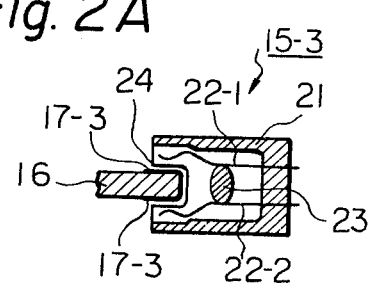
FIGS. 2A and 2B are cross-sectional views taken along the line 2—2 of FIG. 1.
Figure 2B:
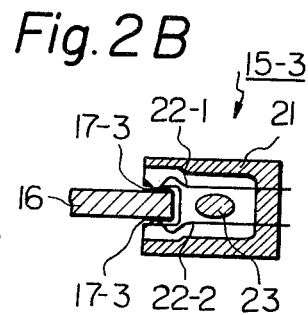

FIGS. 2A and 2B are cross-sectional views taken along the line 2—2 of FIG. 1, which show the structure of the I/O connector comprised of the zero-insertion-force connector. In FIG. 2A, the reference numeral 21 indicates a housing of the I/O connector. The housing 21 rigidly holds a pair of I/O contacts 22-1 and 22-2. In this Figure, the I/O contacts 22-1 and 22-2 abut against a cam 23 at its ends along the major axis thereof and are bent outwardly. In this case, the printed I/O pins 17-3 do not come into contact with these I/O contacts and the card 16 can be freely inserted into the housing 21 along a guide trench 24. When the card 16 is inserted into the housing 21, the cam 23 is rotated 90° with respect to the center thereof such as shown in FIG. 2B. In this case, the I/O contacts 22-1 and 22-2 are not forced and bent outwardly and, therefore, can be brought into contact with the printed I/O pins 17-3. For removing the card 16 from the I/O connector, the cam 23 is again rotated at an angle of 90° in order to bend the I/O contacts 22-1 and 22-2 outwardly. The cam 23 is manually rotated by means of a lever 25 (not shown in FIGS. 2A and 2B but shown in FIG. 1).

In FIG. 1, the poles 13-1 through 13-4, acting as power supply means, may be electrically connected with a respective power source (not shown) via appropriate connector means (not shown). The appropriate connector means according to the present invention will be described hereinafter by referring to FIG. 3.

In FIG. 3, the printed circuit card stack 11 is mounted on laminated conductor plate 31 comprising of a first conductor plate 31-1, a second conductor plate 31-2 and a third conductor plate 31-3. An insulation layer is inserted between the plates 31-1 and 31-2, and also between the plates 31-2 and 31-3. The first conductor plate 31-1 is connected to a first power source (not shown) of, for example, $-5.2$ V; the second conductor plate 31-2 is connected to a second power source (not shown) of, for example, $-2$ V; and the third conductor plate 31-3 is grounded. When the first, second and third poles 13-1, 13-2 and 13-3 are respectively set to the potential levels of, for example, $-5.2$ V, $-2$ V and ground, then these three poles 13-1, 13-2 and 13-3 are connected directly to the first, second and third conductor plates 31-1, 31-2, and 31-3, respectively.

Figure 4A:
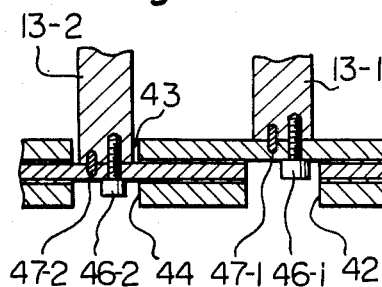
FIGS. 4A and 4B are cross-sectional views taken along the line 4A—4A of FIG. 3 and the line 4B—4B of FIG. 3, respectively.
Figure 4B:
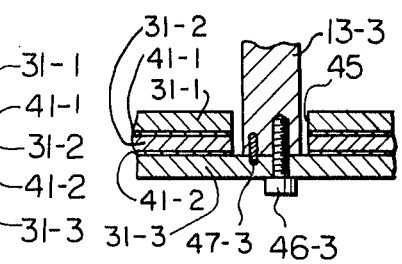

In FIGS. 4A and 4B, cross-sectional views taken along the line 4A—4A and along the line 4B—4B of FIG. 3, respectively. The structure for effecting the above-mentioned connection between each pole and its corresponding conductor plate will be described. Conductor plates 31-1, 31-2 and 31-3 are laminated via insulation layers 41-1 and 41-2. The insulation layers may be made from adhesive material composed of an epoxy resin or glass-epoxy resin. Throughhole 42 is formed in the second and third conductor plates 41-2 and 41-3, whereby the first pole 13-1 is electrically and rigidly connected to the first conductor plate 31-1. Similarly, throughholes 43 and 44 are formed respectively in the plates 31-1 and 31-3, whereby the second pole 13-2 is electrically and rigidly connected to the second plate 31-2. An additional throughole 45 is formed in the plates 31-1 and 31-2, whereby the third pole 13-3 is electrically and rigidly connected to the third plate 31-3. The reference numerals 46-1, 46-2 and 46-3 represent tightening bolts, and the reference numerals 47-1, 47-2 and 47-3 represent guide pins which are utilized for facilitating the positioning operation of the poles 13-1 through 13-3. Accordingly, a voltage ($-5.2$ V) from the first power source is applied to the first pole 13-1; a voltage, ($-2$ V) from the second power source is applied to the second pole 13-2; and the third pole 13-3 is grounded.

Figure 5:
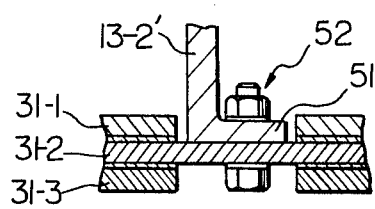
FIG. 5 is a cross-sectional view of a modified tightening means for connecting, for example, a second pole 13-2 of FIG. 4A with a second conductor plate 31-2 of FIG. 4A, according to the present invention.

FIG. 5 is a cross-sectional view of a modified tightening means for connecting, for example, the pole 13-2 with the second conductor plate 31-2 of FIG. 4A. In FIG. 5, a second pole 13-2' has an L-shaped leg 51 at its bottom. The leg 51 is electrically and rigidly connected to the second conductor plate 31-2 by means of a nut and bolt 52.

FIG. 6 is a perspective view of the laminated conductor plates 31 of FIG. 3, which are provided with lead terminals, according to the present invention. A first lead terminal 61-1 is secured to the first conductor plate 31-1. Similarly, a second lead terminal 61-2 and a third lead terminal 61-3 are respectively secured to the second conductor plate 31-2 and to the third conductor plate 31-3. First power source 62-1 and second power source 62-2 are connected to the first and second conductor plates 31-1 and 31-2 via the lead terminals 61-1 and 61-2, respectively.

The power sources 62-1 and 62-2 can be located far from the laminated conductor plates 31 such as shown in FIG. 6. However, it is desirable to locate the power source close to the plates 31 in order to reduce the total size of the computer construction.

Figure 7:
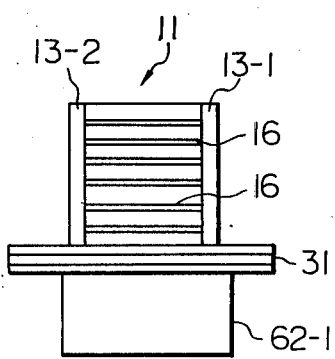
FIG. 7 schematically illustrates the arrangement of a stack 11 (FIG. 1) and a power source 62-1 (FIG. 6), according to the present invention.

FIG. 7 schematically illustrates the arrangement of the stack 11 (FIG. 1) and one of the power sources 62-1 (FIG. 6). In FIG. 7, the power source 62-1 is located very close to the laminated conductor plates 31. In other words, the power source 62-1 and the plates 31 are constructed as one body. The second power source 62-2 can also be arranged in the same manner as shown in this Figure. The first power source 62-1 is electrically and rigidly connected to the first conductor plate 31-1 of the laminated conductor plates 31. The connection between the power source 62-1 and the first conductor plate 31-1 will be described by referring to FIG. 8.

Figure 8:
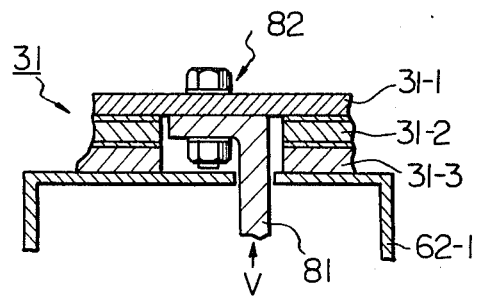
FIG. 8 is a partial, cross-sectional view of a laminated conductor plate 31 (FIG. 7) and the first power source 62-1 (FIG. 7)

FIG. 8 is a partial cross-sectional view, wherein the output voltage V from the first power source 62-1 is applied to the first conductor plate 31-1 by way of a lead terminal 81, which is, for example, L-shaped. The lead terminal 81 is electrically and rigidly connected to the first conductor plate 31-1 by means of a nut and bolt 82. It is preferable to coat a chemical compound on the contact surfaces of the plate 31-1 and lead terminal 82, in order to protect these members from being oxidized by air and also to remove the already present oxidized layers from the contact surfaces. The chemical compound should also be coated on the corresponding contact surfaces shown in FIGS. 4A, 4B and 5.

Figure 9A:
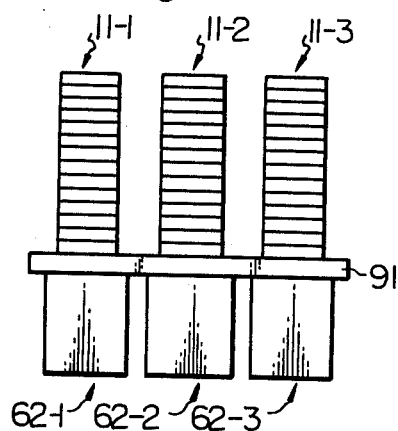
FIGS. 9A through 9F schematically illustrate various arrangements of three printed circuit card stacks together with three power sources.
Figure 9B:
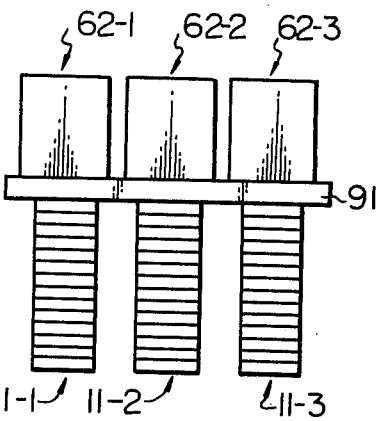
Figure 9C:
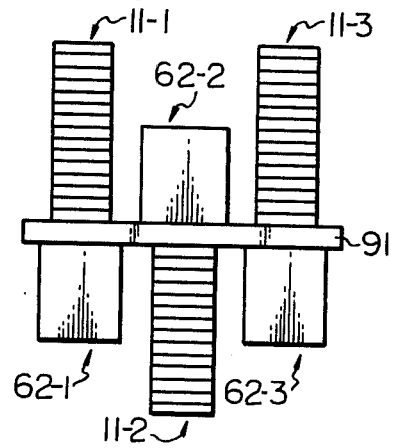
Figure 9D:
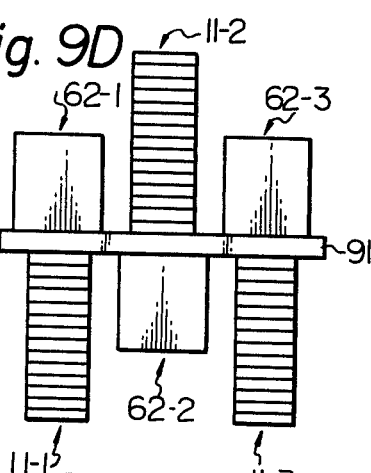
Figure 9E:
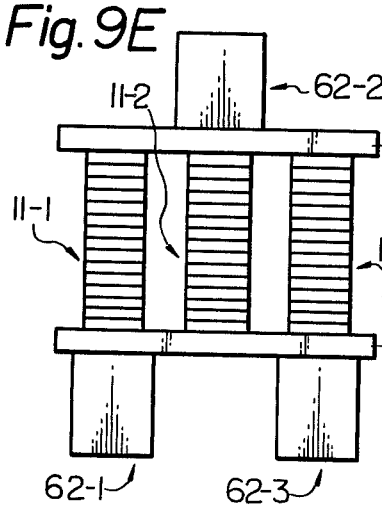
Figure 9F:
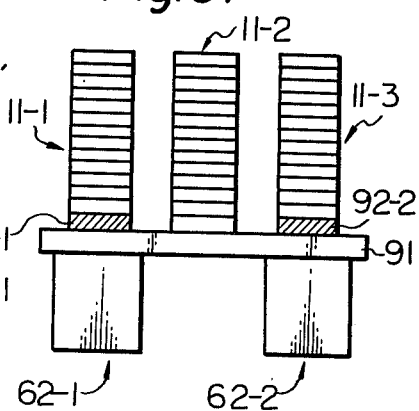

In the large-scale computer system, two or more different printed circuit card stacks and also two or more different power sources are required. FIGS. 9A through 9F schematically illustrate examples of various arrangements of three printed circuit card stacks together with, three power sources. In FIGS. 9A through 9F, the reference numerals 11-1, 11-2 and 11-3 represent, respectively, the first, second and third stacks; the reference numerals 62-1, 62-2 and 62-3 represent, respectively, the first, second and third power sources. These members 11-1 through 11-3 and 62-1 through 62-3 are arranged on and below the laminated conductor plate 91 corresponding to the aforesaid laminated conductor plates 31. The laminated conductor plate 91 may be comprised of first, second, third and ground conductor plates, and also of insulation layers inserted therebetween. In the arrangement of FIG. 9E, there are two different laminated conductor plates 91 and 91'. In the arrangement of FIG. 9F, the third power source 62-3 is divided into two small power sources 92-1 and 92-2. The small power sources 92-1 and 92-2 are mounted in the stacks 11-1 and 11-3, respectively.

Figure 10A:
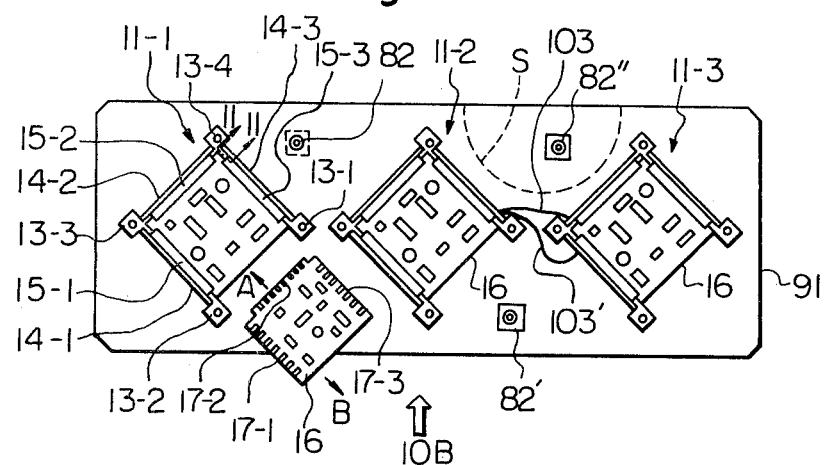
FIG. 10A is a plane view showing an arrangement of three stacks 11-1, 11-2 and 11-3 mounted on a laminated conductor plate 91.
Figure 10B:
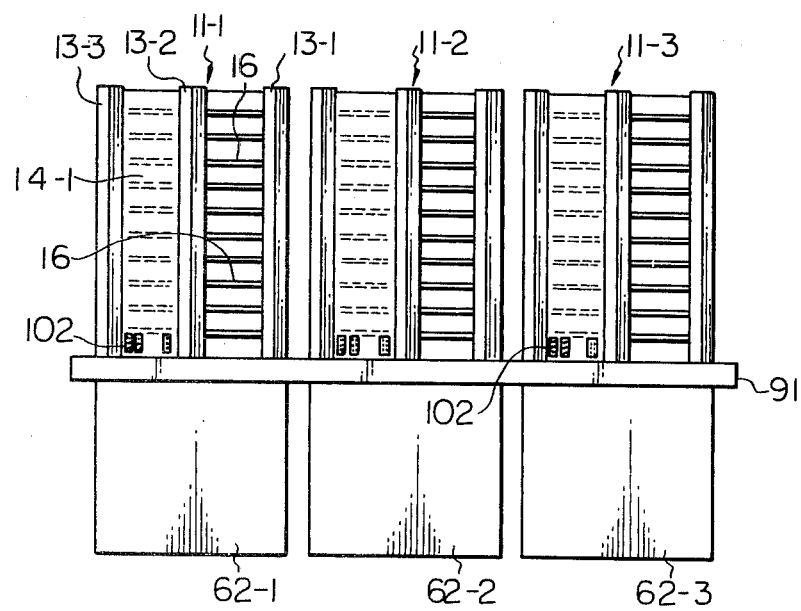
FIG. 10B, is a front view of the arrangement shown in FIG. 10A seen from the arrow 10B of FIG. 10A.

It is preferable to arrange the three stacks 11-1 through 11-3 in such a manner that two adjacent stacks face each other at an angle of about 45°, as shown in FIG. 16A. That is, FIG. 10A is a plane view showing the arrangement of the three stacks 11-1, 11-2 and 11-3 mounted on the laminated conductor plate 91, in which each top cover (see top cover 101 in FIG. 1) is taken away from the respective stack. FIG. 10B is a front view of both stacks and power sources seen from the arrow 10B of FIG. 10A. In FIG. 10A, the members designated by the reference numerals 11-1, 11-2, 11-3, 13-1, 13-2, 13-3, 13-4, 14-1, 14-2, 14-3, 15-2, 15-3 and 16 have already been described hereinbefore with reference to FIG. 1. The I/O connector 15-1 in FIG. 10A is not shown in FIG. 1. The nut and bolt 82 (see FIG. 8) connects the laminated conductor plates 31 electrically and rigidly to the corresponding power source 62-1 (FIG. 10B). As seen in FIG. 10A, the card 16 is inserted into the stack 11-1 along the direction of the arrow A, and the card 16 is taken out therefrom along the direction of the arrow B at an angle of about 45° with respect to the side of the plate 91. The advantage of the arrangement shown in FIG. 10A is that maintenance of these stacks can be carried out very easily, because each of the mother boards (14-1, 14-2 . . . ) has a wide space (schematically defined by the dotted line "S" in FIG. 10A) in front thereof. The operator can handle tools with much freedom repairing or reconstructing the stack by utilizing the wide space S. Furthermore, the arrangement shown in FIG. 10A has an advantage in that lead wires for electrically connecting two adjacent stacks, for example, stacks 11-2 and 11-3, can be bridged therebetween by means of auxiliary connectors 102 (shown in FIGS. 10B and (1) while forming a minimum length of path therebetween. The lead wires are indicated by reference numerals 103 and 103' in FIG. 10A.

As previously mentioned, in a large-scale computer system, various kinds of power sources are required. Firstly, master-slave type power sources are often required in such large-scale computer system. Usually, the master power source is continuously activated during operation of the computer system. In this case, for example, the first power source 62-1 may act as the master power source and the second power source 62-2 may act as the slave power source in the arrangement of FIG. 10B. Secondly, four or more different kinds of power sources may be required, for example, four power sources having voltages of $-5.2$ V, $-2$ V, $+2$ V and $+5.2$ V, respectively. In this case, the laminated conductor plate has first, second, third, fourth and fifth conductor plates having voltages of $-5.2$ V, $-2$ V, $+2$ V, $+5.2$ V and ground, respectively. Accordingly, the first, second, third and fourth poles 13-1, 13-2, 13-3 and 13-4 are energized at voltages of, for example, $-5.2$ V, $-2$ V, $+2$ V and ground, respectively. Consequently, either one of said poles must be energized at two different voltage levels in order to introduce the voltage of $+5.2$ V into the stack.

Figure 11:
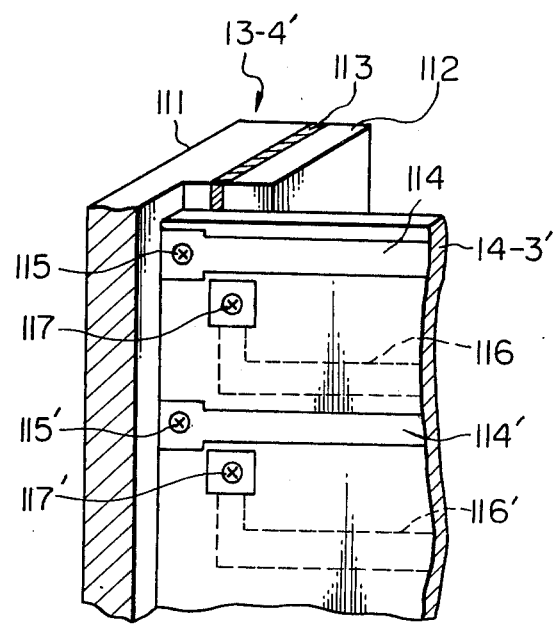
FIG. 11 is an enlarged partial perspective view of a pole taken along the line 11—11 of FIG. 10A.

FIG. 11 is an enlarged partial perspective view of a pole taken along the line 11—11 of FIG. 10A. The pole is energized at two different voltage levels. In FIG. 11, a pole 13-4' is divided into two poles 111 and 112. These poles 111 and 112 are electrically separated by an insulation layer 113. The pole 111 is energized at a voltage level $V_1$ of, for example, ground, and the pole 112 is energized at another voltage level $V_2$ of, for example, $+5.2$ V. The voltage $V_1$ of the pole 111 is applied to conductive patterns 114 and 114' printed on one layer of a mother board 14-3' by way of conductive fitting screws 115 and 115'. The voltage $V_2$ of the pole 112 is applied to conductive patterns 116 and 116' printed on the other layer of the mother board 14-3' by way of conductive fitting screws 117 and 117'. The conductive patterns 114, 114', 116 and 116' are electrically connected to the corresponding I/O contacts (not shown in FIG. 11, but shown in FIGS. 2A and 2B as members referenced by the numerals 22-1 and 22-2) of the corresponding I/O connector (not shown in FIG. 11 but shown in FIGS. 1, 2 and 10A as the member referenced by the numeral 15-3). It should be noted that the mother board 14-3' also has a great number of conductive patterns (not shown) for electrically connecting one LSI on one card 16 with the corresponding LSI on another card 16. The above explanation is provided with respect to only one of the poles and also to only one of the mother boards. However, the other poles and the other mother boards may also have a construction which is similar to that of the above-described pole and mother board.

As seen in FIG. 10A, three mother boards 14-1 through 14-3 are respectively attached to three sides of the stack 11-1. However, in the case where a small number of LSI packages or ultra-LSI packages are mounted on each card 16, it is not necessary to use the printed I/O pins 17-1 and 17-3 since it is sufficient to use only the printed I/O pins 17-2. In this case, the mother boards 14-1 and 14-3 can be respectively replaced by ordinary boards. Furthermore, the I/O connectors 15-1 and 15-3 are replaced respectively by ordinary guide rails having trenches for slidably supporting the peripheries of the cards. In the case where relatively few LSI packages or ultra-LSI packages are mounted on each card 16, it is sufficient to use any one of the three printed I/O pins 17-1 through 17-3. At the same time, it is also sufficient to use any one of the corresponding mother boards 14-1 through 14-3. In all cases, the cards 16 accommodated in the stack 11-1 (11-2, 11-3) are enclosed by three walls comprised of mother boards or ordinary boards. Accordingly, hot air in the stack produced by heat dissipation from the LSI package or ultra-LSI package cannot be easily removed from the stack. Due to this problem, the printed circuit card construction of the present invention may require a suitable means for cooling the stack. The cooling means can be comprised of a layer having a high degree of heat conductivity, such as a ceramic plate and the so-called cold plate. In this case, an air flow must be created in each space between two adjacent cards 16 in the stack. As shown in FIG. 10A, when only two mother boards 14-1 and 14-3 are respectively attached to two sides of the stack 11-1, or when only two ordinary boards are replaced by the two mother boards 14-1 and 14-3, a conventional cooling process may be employed in the printed circuit card construction, which conventional cooling process includes an air flow applied from one opening of the stack 11-1 to another opening thereof.

As is apparent from the above description, the printed circuit card construction of the present invention has many advantages which are stated in the following items (1) through (8).

(1) In each of the stacks, the total length of the lead wires for connecting certain LSIs on one printed circuit card to the corresponding LSIs on another printed circuit card can be extremely reduced by means of the mother boards.

(2) A large number of I/O pins can be printed on each printed circuit card due to the presence of the I/O connectors which are engageable with at most three peripheries of each printed circuit card.

(3) Since electric power is supplied via a pole having a very large cross-sectional area, a voltage drop along the pole is very small; accordingly, there is almost no voltage difference between the LSIs mounted on the bottom card and the LSIs mounted on the top card of each stack.

(4) Since the LSIs in the stack and the power source are connected by a very short conductive path, a voltage drop which can cause a defective operating condition cannot occur therebetween.

(5) The total length of the lead wires which connect certain LSIs in one stack with the corresponding LSIs in another stack can be extremely reduced (see the lead wires 103 and 103' in FIG. 10A).

(6) There is almost no occurrence of voltage drop between one stack and another stack because these stacks are electrically connected together by means of relatively large conductive plates (see plates 91 in FIGS. 10A and 10B).

(7) Various kinds of power sources can be connected to each stack via laminated conductor plate single (refer to 91 in FIGS. 10A and 10B).

(8) Since both the poles and the laminated conductor plates simultaneously act as power supply means and mechanically supporting means, the total weight and the size of the printed circuit card construction may be considerably reduced.

What is claimed is:

1. A printed circuit card construction comprising a base having a plurality of conductor plates laminated together and at least one printed circuit card stack mounted on said base, said at least one card stack comprising: a plurality of poles selectively electrically connected to said conductor plates; at least one mother board, each said mother board being supported by two adjacent ones of said poles; a plurality of Input/Output connectors fixed on each said mother board; and a plurality of cards held at their peripheries by corresponding ones of said Input/Ouput connectors; said poles comprising both mechanical means for supporting each said mother board and electrical means for supplying electrical power to each said mother board.

2. A construction as set forth in claim 1 further comprising at least one power source selectively connected to said conductor plates by respective lead terminal(s).

3. A construction as set forth in claim 2, at least one of said lead terminals comprising direct connection of the respective selectively connected power source(s) and conductor plate(s).

4. A construction as set forth in claim 3 comprising at least two of said card stacks and at least two of said power sources respectively mounted above and below said laminated conductor plates.

5. A construction as set forth in claim 3 comprising a plurality of said card stacks and a plurality of said power sources respectively mounted below and above said laminated conductor plates.

6. The construction as set forth in claim 3, comprising at least one of said card stacks, and at least one of said power source(s) mounted on the same side of said laminated conductor plates.

7. A construction as set forth in claim 3, wherein at least one of said power sources is accommodated in one of said card stacks.

8. A construction as set forth in claim 1, comprising at least one laminated conductor plate selectively located at the top of said card stack(s).

9. A construction as set forth in claim 4 comprising at least two of said card stacks arranged on said laminated conductor plates adjacent each other at an angle to allow maximum access to said card stacks for removal and repair.

10. A construction as set forth in claim 1, wherein at least one of said Input/Output connectors comprises a zero-insertion-force connector.

11. A contruction as set forth in claim 1, at least one of said poles comprising two or more longitudinal pole parts, at least two of said pole parts being electrically insulated from each other.

12. A construction as set forth in claim 1, at least one of said card stacks(s) comprising cooling means.

13. The construction of claim 5, comprising at least two of said card stacks arranged on said laminated conductor plates to be adjacent to each other at an angle to allow maximum access to said card stacks for removal and repair.

14. The construction of claim 9 wherein said angle is about 45°.

15. The construction of claim 13, wherein said angle is about 45°.

16. The construction of claim 1, wherein said connectors are arranged on each said mother board in parallel to each other and parallel to said base.

17. The construction of claim 12 comprising two mother boards.

18. The construction of claim 17, said cooling means comprising means for generating airflow.

19. The construction of claim 17, said airflow generating means comprising means causing airflow between two openings in said at least one card stack.

* * * * *